United States Patent [19]

Henely et al.

[11] Patent Number: 5,384,550
[45] Date of Patent: Jan. 24, 1995

[54] LOOP TRANSIENT RESPONSE ESTIMATOR FOR IMPROVED ACQUISITION PERFORMANCE

[75] Inventors: Steven J. Henely; Robert H. Pool, both of Cedar Rapids, Iowa

[73] Assignee: Rockwell International Corporation, Seal Beach, Calif.

[21] Appl. No.: 947,230

[22] Filed: Sep. 18, 1992

[51] Int. Cl.⁶ .................... H03L 7/08; H03L 7/107
[52] U.S. Cl. .................... 331/17; 331/10; 331/16
[58] Field of Search ........... 331/10, 15, 16, 17, 331/DIG. 2; 455/260

[56] References Cited

U.S. PATENT DOCUMENTS

| | | | |
|---|---|---|---|
| 3,748,590 | 7/1973 | Gray | 331/12 |
| 3,768,030 | 10/1973 | Brown et al. | 331/12 |
| 4,007,429 | 2/1977 | Cadalora et al. | 331/DIG. 2 X |
| 4,074,207 | 2/1978 | Forsberg | 331/1 A |
| 4,107,624 | 8/1978 | Turner | 331/10 X |
| 4,354,277 | 10/1982 | Crackel et al. | 455/259 |
| 4,367,444 | 1/1983 | Gardner et al. | 332/19 |
| 4,419,759 | 12/1983 | Poklemba | 357/97 |
| 4,454,604 | 6/1984 | Myers | 375/1 |
| 4,563,767 | 1/1986 | Brandt | 375/120 |
| 4,614,917 | 9/1986 | Zelitzki et al. | 331/DIG. 2 X |
| 4,745,372 | 5/1988 | Miwa | 331/DIG. 2 X |
| 4,896,336 | 1/1990 | Henely et al. | 375/80 |
| 5,208,546 | 5/1993 | Nagaraj et al. | 331/25 X |
| 5,220,294 | 6/1993 | Ichikawa | 331/16 X |
| 5,247,265 | 9/1993 | Norimatsu | 331/16 |
| 5,276,408 | 1/1994 | Norimatsu | 331/16 X |

FOREIGN PATENT DOCUMENTS

0072593  2/1983  European Pat. Off. .............. 331/10

OTHER PUBLICATIONS

A. Mileant and S. Hinedi, "Analysis of Lock Detection in Costas Loops", Jul. 1991, Technical Support Package for NASA Tech Brief, vol 15, No. 7, Item No. 86, JPL Invention Report, NPO-18102/7612 (no page #s).

Charles R. Cahn, "Improving Frequency Acquisition of a Costas Loop", Dec. 1977, IEEE Transactions on Communications, vol. Com-25, No. 12, pp. 1453-1459.

Primary Examiner—David Mis
Attorney, Agent, or Firm—Gregory G. Williams; M. Lee Murrah; H. Fredrick Hamann

[57] ABSTRACT

An apparatus and method for improving the capture performance of frequency and phase locked loops. The invention permits improved capture performance while, at the same time, maintaining the signal-to-noise ratio performance of the loop while the loop is tracking. The invention estimates the transient response of an automatic control loop. This estimate is used to control elements added to a PLL to accelerate acquisition, and eliminate the noise contribution of those added elements while the loop is tracking. The system uses the variation in the gradient of the loop transient response to derive an estimate of the loop's distance from lock. The system then uses this estimate to control loop parameters which affect the loop's acquisition.

38 Claims, 2 Drawing Sheets

LOOP TRANSIENT RESPONSE ESTIMATOR FOR IMPROVED ACQUISITION PERFORMANCE

BACKGROUND OF THE INVENTION

A. Technical Field

The present invention relates to phase, frequency-locked and similar loops. Although such loops as phase and frequency-locked loops commonly find application in data communications systems, their use is not limited to communication systems and the present invention may be applied in other areas with equal advantage.

B. Problems in the Art

Phase and frequency-locked loops (or locking loops referred to in the following application are meant to be either frequency or phase locked loops unless otherwise specified) are used in many applications, including communication systems, to demodulate signals. The locking loop demodulation scheme may be employed whether the signals are digital or analog, base-band or band-pass, narrow-band or spread spectrum. Locking loops use a feedback mechanism to acquire and track transmitted signals. For demodulation, the received signal is routed to a phase or frequency detector which develops a signal related to the difference between the received signal's phase and a local, reference signal's phase. The difference, or error, signal thus developed is fed back to control the frequency and/or phase of the reference signal. This feedback mechanism permits the loop to acquire and track the transmitted signals.

Before a loop can track a signal, it must first acquire the signal. The acquisition range of a loop is, typically, considerably greater than the tracking range but, especially under conditions of low signal-to-noise ratio, the loop's acquisition time rapidly increases with initial frequency error. This increase in acquisition time represents loss of channel capacity; and any reduction in acquisition time translates directly to a corresponding increase in valuable channel capacity.

Additionally, it is desirable to extend the acquisition range of a phase or frequency locked loop since that permits accommodation of a greater variation in signal frequencies. Such variations may be due to oscillator drift and to Doppler shift in mobile systems, the combination of which can amount to a significant fraction of a system's symbol rate. That is, those frequency shifts, if not compensated for, could lead to false negative or false positive symbol recognition.

Loop parameters can be adjusted to accelerate acquisition of a signal frequency, but, unfortunately, those adjustments result in signal-to-noise degradation. If loop parameters could be adjusted for fast acquisition, then, when the loop is close to locking, readjusted to provide an optimum signal-to-noise ratio for tracking and normal operation, a great improvement over current systems would be realized.

There have also been other attempts at reducing loop acquisition time. One method for deriving control of loop parameters is based on a Phase-Locked-Loop's (PLL's) frequency error. This method, however, puts severe limits on the adjustment of the loop parameters—limits which are greatly reduced by the method of the current invention.

Other approaches to improve Locking Loop performance employ spectral analysis of the received signal to produce a coarse estimate of the offset between the received signal and the reference signal. The reference signal is then adjusted to reduce this offset. This approach is very compute-intensive though, requiring additional hardware and expense. Further, the method is limited by the computational speed of the additional hardware.

An aiding loop such as an automatic frequency control (AFC) loop can be added to a PLL to accelerate the PLL's signal acquisition. However, the added gain element of the AFC contributes additional noise to the received signal. It is important, therefore, to be able to manipulate the AFC gain in such a way as to both accelerate acquisition when the PLL is not locked and to maximize the signal-to-noise ratio when the PLL is locked. In order to achieve these goals, a good estimate of the AFC's proximity to lock is needed. Further, a method of employing this estimate to properly control the AFC loop parameters to achieve these diverse goals is also needed.

It is therefore an object of the present invention to improve the capture performance of locking loops such as phase locked loops or frequency locked loops while maintaining the signal-to-noise ratio of a signal which is introduced to the locking loop.

It is a further object of the present invention to establish these improvements in a cost effective fashion.

These and other objects, features and advantages will become more apparent with reference to the accompanying specification and claims.

SUMMARY OF THE INVENTION

The present invention is a means and method for estimating the transient response of an automatic control loop. This estimate is used to control elements added to a PLL or similar device such as a frequency-locked-loop to accelerate acquisition, and to eliminate the noise contribution of those added elements while the loop is tracking.

As a loop acquires lock, there is a characteristic variation in the gradient of the loop transient response. The system of the present invention employs this variation to derive an estimate of the loop's distance from lock. The system of the present invention then uses this estimate to control loop parameters which affect the loop's acquisition.

One embodiment of the present invention adds an AFC loop to a PLL. The AFC comprises a circuit used to obtain the gradient of the PLL transient response, an adaption rule used to modify the AFC gain, and a gain circuit inserted into the PLL between the PLL's phase detector and the PLL filter.

In operation, the AFC obtains the gradient of the loop transient response, and uses the gradient to apply the adaption rule; thereby determining the proper level of gain to use in conjunction with the PLL phase detector output. The gradient of the loop transient response provides an indication of the loop's proximity to lock. When out of lock, the AFC gain is initially set at a high value, thereby magnifying the error signal going to the loop filter and maximizing the frequency adjustment of the PLL's voltage controlled oscillator. (Numerically controlled oscillator in the case of a digital embodiment.) As the AFC loop approaches lock, the AFC gain is decreased until, at a threshold proximity to lock, the AFC gain is set at a minimum value. In this way, the AFC loop gain accelerates acquistion by the PLL but does not, after acquisition is achieved, degrade the PLL's signal-to-noise ratio.

DESCRIPTION OF THE PREFERRED EMBODIMENT

Figure 1:
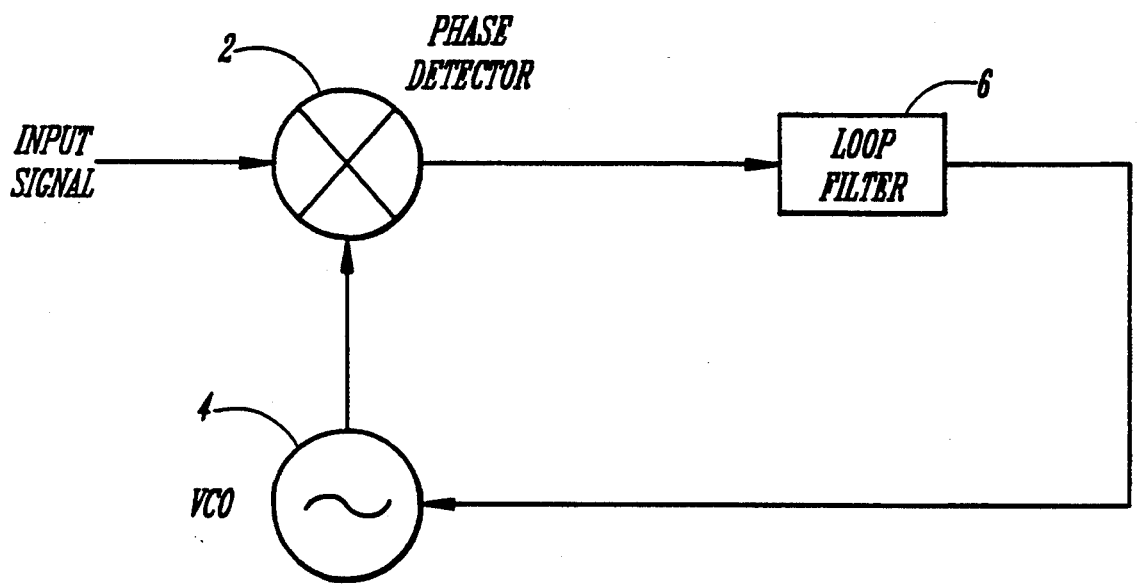
FIG. 1 is a block diagram of a basic PLL.

FIG. 1 illustrates a block diagram of a basic PLL. An INPUT SIGNAL is routed to a phase detector 2 which creates an output proportional to the phase difference between the INPUT SIGNAL and the reference signal supplied by a voltage controlled oscillator (VCO) 4. The output of the phase detector is filtered by a loop filter 6, and the filtered signal is fed back to VCO 4 as a reference voltage. Variations in the reference voltage cause VCO 4 to change frequency in the direction of the INPUT SIGNAL'S frequency until, eventually, the reference signal is matched in phase and frequency to the INPUT SIGNAL. Subsequent changes in the input frequency are tracked by the PLL.

Figure 2:
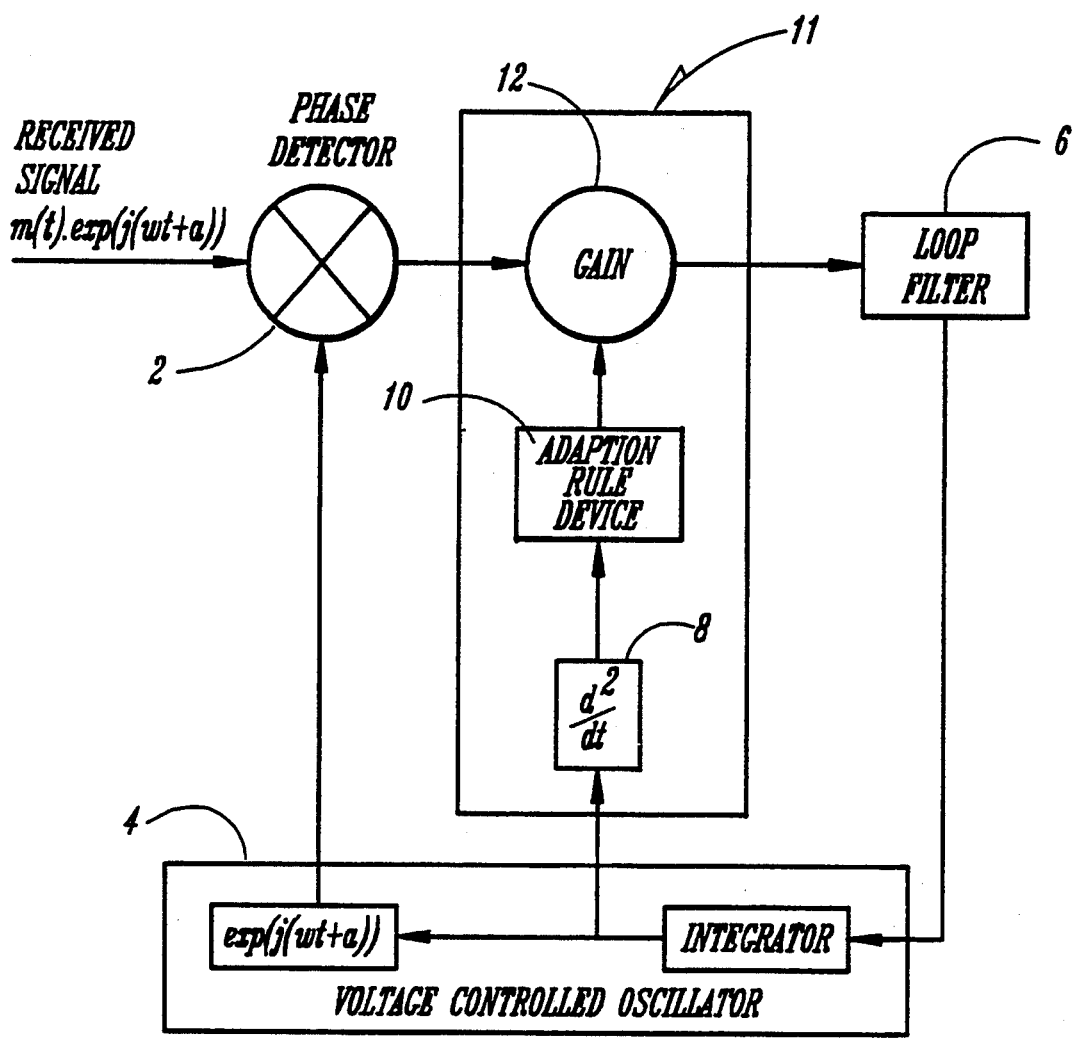
FIG. 2 illustrates a PLL with the present invention added.

FIG. 2 illustrates a conventional PLL with the embodiment of element 11 according to the present invention added. A differentiator 8 takes the second derivative of loop filter 6 output and feeds the result to an adaption rule device 10. If the differentiator was connected ahead of the integrator of the VCO, only the first derivative would be needed. Adaption rule device 10 controls a gain element, or amplifier, 12 based on the output of differentiator 8.

This embodiment of element 11 of the present invention, in conjunction with the components of the PLL, constitutes an AFC loop, which permits the acceleration of the lock for a PLL.

Figure 3:
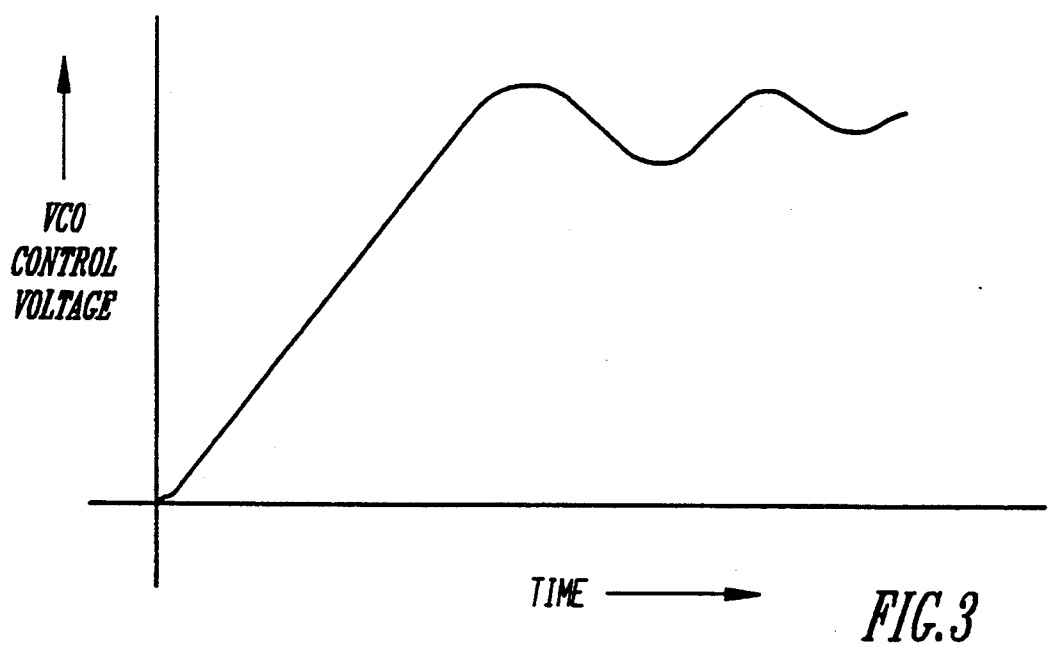
FIG. 3 is a graphical representation of an AFC's transient response.

FIG. 3 displays a characteristic transient response of an aiding loop and an AFC loop of the type used in the present invention. As can be seen from the figure, the transient response is exponential in character, with a degree of overshoot and "ringing" which commences as the aiding loop approaches the lock condition. The system of the present invention utilizes this characteristic, the overshoot, "ringing", and decreasing gradient, to determine the aiding loop's proximity to lock and, based on this analysis, to vary the gain of the aiding loop, thereby accelerating loop capture. The system also maximizes the signal-to-noise ratio of the input signal by varying the gain of the aiding loop.

In actual operation, when the locking loop is out of lock, AFC gain element 12 is set to a high value. The appropriate value for the gain is determined on an individual basis; but it should be set as high as possible in order to bring the VCO to the proper frequency (i.e., that of the input signal) as quickly as possible, but the gain cannot be set so high as to create an unstable loop. The relationship between gain and loop stability is well known in the art and may be determined on an individual basis by a person of ordinary skill in the art.

After setting the gain to a high value, the output of differentiator 8 is monitored to detect a sign reversal in the gradient of the aiding loop response curve. As can be seen in FIG. 3, this sign reversal will occur when the phase locked loop nears the lock condition. When the gradient of the aiding and AFC loop's transient response changes sign, the aiding loop gain element 12 is decremented. With each sign reversal in the aiding and AFC loop gradient the adaption rule device 10 decrements aiding loop gain element 12. In the present embodiment, three gain steps are employed, but other embodiments with more or fewer steps are possible.

Eventually, when the phase locked loop achieves lock, (i.e., when the gradient of the loop error signal changes sign) gain element 12 can then be switched out of the loop path entirely, which eliminates the gain element's contribution to the degradation of the locking loop's signal-to-noise ratio for the signal extraction operation which occurs after phase acquisition is achieved.

It will be appreciated that the present invention can take many forms and embodiments. Other loop parameters could be modified based on the proximity to lock derived by the system of the present invention. For example, the pass-band of the loop filters within the loop could be narrowed as the loop approaches lock to improve performance.

Additionally, the loops of the present invention are not limited to phase locked loops aided by a frequency locked loop. Any combination of PLLs, FLLs and similar devices may be employed.

The true essence and spirit of this invention are defined in the appended claims, and it is not intended that the embodiment of the invention presented herein should limit the scope thereof.

We claim:

1. Means for improving a locking loop's acquisition performance, comprising:

a locking loop comprising a device having a first input for an electrical input signal, a second input for an electrical reference signal, a detector to detect a difference between the input signal and the reference signal, and an output for an electrical error signal representing the difference generated by the device, said error signal being electrically communicated back to the second input as the reference signal, an oscillator which receives the error signal and generates the reference signal;

an aiding loop electrically coupled to and incorporated with said locking loop, the aiding loop including a sensor for sensing a characteristic of the error signal during the transient period related to closeness to lock and producing a closeness to lock'signal correlated thereto, a control device which receives the closeness to lock signal and generates a control signal, and a device which receives the control signal, for altering a loop parameter; and means for adjusting said loop parameter of said aiding and locking loop based on the closeness to lock signal, the control signal varying the loop parameter to accelerate acquisition of lock during the transient period but varying the loop parameter to optimize signal to noise ratio when in close proximity to and at lock.

2. The means for improving the performance of a locking loop of claim 1 wherein said locking loop is a frequency locked loop.

3. The means for improving the performance of a locking loop of claim 1 wherein said locking loop is a phase locked loop.

4. The means for improving the performance of a locking loop of claim 1 wherein said loop parameter to be adjusted includes the loop gain.

5. The means for improving the performance of a locking loop of claim 1 wherein said loop parameter to be adjusted includes the pass band of the locking loop.

6. A method for improving the performance of a locking loop comprising:

electrically inputting an electrical input signal to a locking loop, the locking loop comprising a device having a first input for an electrical input signal, a second input for an electrical reference signal, a detector to detect a difference between the input signal and the reference signal, and an output for an electrical error signal representing the difference generated by the device, said error signal being electrically communicated back to the second input as the reference signal, an oscillator which receives the error signal and generates the reference signal;

sensing a characteristic of the error signal during the transient period related to closeness to lock and producing a closeness to lock signal correlated thereto, generating a control signal; and adjusting a loop parameter based on the control signal, the control signal varying the loop parameter to accelerate lock during the transient period but varying the loop parameter to optimize signal to noise ratio when in close proximity to and at lock.

7. The method for improving the performance of a locking loop of claim 6 wherein said locking loop is a phase locked loop.

8. The method for improving the performance of a locking loop of claim 6 wherein said locking loop is a frequency locked loop.

9. The method for improving the performance of a locking loop of claim 6 wherein the aiding loop is a phase locked loop.

10. The method for improving the performance of a locking loop of claim 6 wherein the aiding loop is a frequency locked loop.

11. The method for improving the performance of a locking loop of claim 6 wherein said parameter to be adjusted includes loop gain.

12. The method for improving the performance of a locking loop of claim 6 wherein said parameter to be adjusted includes pass band of the locking loop.

13. An aiding loop and phase locked loop combination for improved phase locked loop performance, the phase locked loop including an oscillator which issues an adjustable reference signal to a phase detector which issues an error signal based on the difference in phase between the reference signal and the input signal to the phase locked loop, the phase locked loop having a loop characteristic which is indicative of closeness to lock and a loop parameter which accelerates acquisition of lock, comprising:

gain means electrically coupled between the phase detector and the oscillator and means for obtaining a gradient of the loop characteristic related to transient response of said loops; and means responsive to the characteristic of the transient response for altering the gain level of the gain means to increase gain to the loops during acquisition of the input signal to accelerate acquisition of the input signal and decrease gain to the loops when close to and at lock to optimize signal to noise ratio.

14. The aiding loop and phase locked loop combination of claim 13 wherein said gain level takes on a plurality of values.

15. The aiding loop and phase locked loop combination of claim 14 wherein said plurality of gain levels comprise higher values of gain when farther away from lock and lower values of gain when closer to lock.

16. The aiding loop and phase locked loop combination of claim 13 wherein the means for controlling gain includes a gain level which effectively provides no gain so as to eliminate any noise contribution to the combination from said means for controlling gain.

17. A method of adaptively adjusting a gain of an aiding/phase locked loop combination, having a gain element, to improve the phase locked loop's acquisition performance, to provide good tracking performance, and to minimize degradation to the signal to noise ratio of a received signal as it transits a phase locked loop, comprising:

setting the gain of the loop combination to a first value which accelerates acquisition of an input signal;

obtaining a gradient of a transient response of the loop combination;

decrementing the gain from said first value of gain of said loop combination when the gradient of said loop combination's transient response changes arithmetic sign; and changing the gain element of said loop combination to a predetermined state when the loop combination has achieved lock.

18. The method of adjusting a gain of an aiding/phase locked loop combination of claim 17 wherein said first value of gain is as high as may be set without compromising loop stability.

19. The method of adjusting a gain of an aiding/phase locked loop combination of claim 17 wherein said decrementing of the gain occurs in a manner whereby the gain reaches its lowest value after a plurality of sign changes.

20. The method of adjusting a gain of an aiding/phase locked loop combination of claim 17 wherein said decrementing of the gain occurs in a manner whereby the gain reaches its lowest value after two sign changes.

21. The method of adjusting a gain of an aiding/phase locked loop combination of claim 17 wherein said decrementing of the gain occurs in a manner whereby the gain reaches its lowest value after one sign change.

22. An apparatus for acquiring frequency lock on a signal, comprising:

frequency a tracking loop;

means for obtaining a parameter related to a transient response of said frequency tracking loop including information related to proximity to the end of said transient response; and means responsive to a change in the parameter for adjusting the operation of the frequency tracking loop, including means to provide frequency tracking loop gain at a first higher level during said transient response, and to provide a lowering or elimination of frequency tracking loop gain based on said information related to proximity to the end of said transient response.

23. The apparatus for acquiring frequency lock on a signal as described in claim 22 wherein said adjusting means alters the rate of change of a frequency in said loop as a function of the value of said parameter.

24. The apparatus for acquiring frequency lock on a signal as described in claim 23 wherein said parameter is related to the overshoot and ringing in said transient response.

25. The apparatus for acquiring frequency lock on a signal as described in claim 24 wherein said parameter is related to the gradient of said transient response.

26. The apparatus for acquiring frequency lock on a signal as described in claim 22 wherein said tracking loop includes gain means and further includes means for altering the gain of the gain means.

27. The apparatus for acquiring frequency lock on a signal as described in claim 26 further including means for eliminating the gain of the gain means from said loop when lock is attained.

28. The apparatus for acquiring frequency lock on a signal as described in claim 22 wherein said frequency tracking loop includes loop filter means and further includes means for altering the bandwidth of the filter means.

29. A locking loop for improved acquisition time and performance where the locking loop comprises an oscillator which issues an adjustable reference signal, a comparator which compares the input signal to the reference signal and issues an error signal correlated to the difference between the two, and feeds back the error signal to the oscillator, and where the oscillator adjusts the reference signal according to the error signal to match and track with the input signal to obtain acquisition of and lock with the input signal, and where the locking loop has a transient period before acquisition of the input signal and has an acquisition once lock is achieved, and where the locking loop has at least one transient characteristic from which proximity to lock can be estimated and has loop parameters which can be adjusted to accelerate acquisition and lock of the input signal, the improvement comprising:
  an aiding loop electrically coupled to the locking loop, the aiding loop comprising;
  a measuring device electrically coupled between the comparator and the oscillator to detect and measure the transient characteristic from which proximity to lock can be estimated;
  a control device electrically coupled to the measuring device and the feeding back to the error signal and which variably adjusts a loop parameter to accelerate lock when in the transient period and optimizes signal to noise ratio when in close proximity to lock and when in lock.

30. The locking loop of claim 29 wherein the transient characteristic is the error signal and the measuring device is a device to take the derivative of the error signal.

31. The locking loop of claim 29 wherein the loop parameter is gain in the locking loop.

32. The locking loop of claim 29 wherein the loop parameter is bandwidth in the locking loop.

33. The locking loop of claim 29 further comprising a loop filter electrically coupled between the comparator and the oscillator and the measuring device is connected to the locking loop after the loop filter.

34. A method of improving the performance of a locking loop, where the locking loop comprises an oscillator which issues an adjustable reference signal, a comparator which compares the input signal to the reference signal and issues an error signal correlated to the difference between the two and feeds back the error signal to the oscillator, and where the oscillator adjusts the reference signal according to the error signal to match and track with the input signal to obtain acquisition of and lock with the input signal, and where the locking loop has a transient period before acquisition of the input signal and has a acquisition period once lock is achieved, and where the locking loop has at least one transient characteristic from which proximity to lock can be estimated and has loop parameters which can be adjusted to accelerate acquisition and lock of the input signal, the improvement comprising:
  measuring the transient characteristic from which proximity to lock can be estimated;
  altering a loop parameter to accelerate lock when in the transient period and to optimize signal to noise ratio when in close proximity to lock and when in the acquisition period.

35. The method of claim 34 wherein the transient characteristic is measured after the input signal and the reference signal have been compared and the error signal generated.

36. The method of claim 34 wherein the loop parameter is altered between the comparator and the oscillator.

37. The method of claim 34 further comprising band pass filtering the error signal between the comparator and the oscillator.

38. The method of claim 37 wherein the measurement of the transient characteristic is after the filtering to reduce the amount of noise in the error signal which further accelerates acquisition.

* * * * *